United States Patent [19]

Frank et al.

[11] Patent Number: 5,396,184

[45] Date of Patent: Mar. 7, 1995

[54] METHOD FOR THE IN SITU IDENTIFICATION OF THE SHEET RESISTIVITY OR, RESPECTIVELY, OF PROCESS PARAMETERS OF THIN, ELECTRICALLY CONDUCTIVE LAYERS MANUFACTURED UNDER THE INFLUENCE OF A PLASMA

[75] Inventors: E-Wolfgang Frank, Unterfoehring; Johann Helneder, Landsham; Peter Kuecher, Munich, all of Germany

[73] Assignee: Siemens Aktiengesellschaft, Munich, Germany

[21] Appl. No.: 954,975

[22] Filed: Sep. 30, 1992

[30] Foreign Application Priority Data

Sep. 30, 1991 [DE] Germany .................. 41 32 562.1

[51] Int. Cl.$^6$ .............................................. G01B 7/06
[52] U.S. Cl. ................................ 324/713; 324/719; 204/298.32; 427/10
[58] Field of Search ................ 156/627; 204/298.32, 204/298.34, 192.33; 324/691, 699, 713, 715, 719; 427/10

[56] References Cited

U.S. PATENT DOCUMENTS

| | | | |
|---|---|---|---|
| 4,543,576 | 9/1985 | Hieber et al. | 340/870.17 |
| 4,562,089 | 12/1985 | Hieber et al. | 427/10 |
| 4,767,496 | 8/1988 | Hieber | 156/627 |
| 4,793,895 | 12/1988 | Kaanta et al. | 156/627 |
| 4,810,335 | 3/1989 | Hieber | 204/192.33 |
| 4,825,148 | 4/1989 | McCurdy et al. | 324/710 |
| 4,868,490 | 9/1989 | Blumenthal | 324/715 |
| 4,954,212 | 9/1990 | Gabriel et al. | 156/627 |
| 5,103,182 | 4/1992 | Moslehi | 324/719 X |

FOREIGN PATENT DOCUMENTS 0067432 12/1982 European Pat. Off. .
0146720 7/1985 European Pat. Off. .

*Primary Examiner*—Kenneth A. Wieder
*Assistant Examiner*—Christopher M. Tobin
*Attorney, Agent, or Firm*—Hill, Steadman & Simpson

[57] ABSTRACT

A method and apparatus for measuring sheet resistivity of a layer manufactured under the influence of a plasma, wherein a current is generated using two voltage or current sources in a circuit that is composed of a first current branch, a sheet resistivity, and a second current branch. The current includes the parasitic current $I_P$ injected into the layer by the plasma, this having a first and second part which are symmetrically supplied into the two current branches which respectively have an identical resistance overall. The currents $I_A$ and $I_B$ thus actually flowing in the first and second current branch are respectively directly measured, or measured on the basis of the voltage drop-off at known precision resistors. A measured current $I_M$ which is independent of the plasma influence is calculated therefrom by averaging, and the sheet resistivity is calculated from $I_M$ and by measuring the voltage drop-off at the sheet resistivity.

11 Claims, 2 Drawing Sheets

METHOD FOR THE IN SITU IDENTIFICATION OF THE SHEET RESISTIVITY OR, RESPECTIVELY, OF PROCESS PARAMETERS OF THIN, ELECTRICALLY CONDUCTIVE LAYERS MANUFACTURED UNDER THE INFLUENCE OF A PLASMA

BACKGROUND OF THE INVENTION

The invention is directed to a method for in situ identification of the sheet resistivity or, respectively, of process parameters of thin, electrically conductive layers manufactured under the influence of a plasma, as utilized, in particular, in semiconductor and thin-film technology, on the basis of a two-point or four-point measuring method. The invention is also directed to applications of the measuring method.

European Patent 0 146 720 corresponding to U.S. Pat. No. 4,562,089 discloses a method of the said species.

Thin-electrically conductive layers are indispensable for, for example, layers of mechanically resistant material, optical coating layers on glasses and, in particular, in microelectronics for the wiring of integrated semiconductor components on a silicon substrate. The stricter and stricter demands made of such layers require a reproducible, utmost layer quality in their manufacture and, thus, require an intense process monitoring that should best ensue in situ, i.e., during the manufacture, in order to obtain maximum information about the process. Moreover, multi-chamber systems, wherein a plurality of process steps with deposition or structuring successively ensue in a plurality of process chambers without interrupting the vacuum, are being increasingly employed in semiconductor and thin-film technology. Since the layer properties change when leaving the vacuum or, respectively, during cooling, an in situ monitoring is desired even in multi-chamber systems since the condition of the layers in the vacuum system is not correctly reflected by subsequent measurements and the course of the status of the layer formation cannot be tracked and controlled in the process.

Typical parameters characterizing a conductive, layer, particularly metal, are structure and constitution as well as stoichiometry. A good measure for these parameters are the electrical properties of the layer, i.e., its resistance.

Although European Patent 0 067 432 corresponding to U.S. Pat. No. 4,543,576 discloses an arrangement for measuring the resistance and the temperature of metallic layers deposited by vapor deposition or sputtering onto substrates during the production of the layer, the method known therefrom is based on the employment of a reference substrate, similar to other known methods. Therefore, measurements can not be undertaken at arbitrary locations directly at the substrate to be processed; rather, specific contacting measures must be undertaken at a specific reference wafer which can then often no longer be integrated into the manufacturing process. In the known arrangement, whereby the measured data are telemetrically transmitted to a receiver, the measurement and transmission electronics is attached in the process chamber, this producing further disadvantages. For example, the temperature stability is low and the process chamber is unavoidably contaminated by exhaust gases of the electronic components, whereas, also, the measuring arrangement itself is not resistant to, for example, aggressive gases that occur given etching plasmas.

Plasma-enhanced etching and deposition processes are being more frequently utilized. An even greater problem in view of measuring a sheet resistivity during the manufacture of the layer or, respectively, of the structure, is inaccurate measurements due to the presence of the plasma. The electrical sheet resistivity measured in situ is falsified as soon as the forming layer comes into the influencing area of the plasma. In, for example, cathode sputtering, in vapor phase deposition (PECVD), or when structuring in RIE, MERLE or ECR reactors, disturbances are induced by the plasma that can often exceed the useful signal by more than 50% and thus cause a considerable mismeasurement. In view of current demands, however, even less than 10% mismeasurement is no longer acceptable in practice.

Among other things, the aforementioned European Patent 0 146 720 proposes a method for measuring the sheet resistivity despite the influence of the plasma, in that the electrical resistance or the voltage drop-off across the layer is identified by at least two, successive, different measuring currents $I_{M1}$ and $I_{M2}$ having a known size, whereby the measuring currents are selected corresponding to the sheet resistivity and the difference between the measuring currents employed is selected in the region of the relationship 2 through 100. Apart therefrom that the implementation of the known method is dependent on a telemetry system, it has turned out, as shall be set forth in greater detail below, that a complete elimination of the influence of the plasma is not possible in the known method, for fundamental electro-technical reasons.

In addition to the sheet resistivity described previously, a monitoring of the process parameters defining the sheet resistivity is also necessary. The layer parameters can be kept within desired, narrow tolerances by adjusting the process parameters. Up to now, monitoring or, respectively, control methods only existed for pressure, power, gas flow or residual gas quality, whereas quantities such as ion current, floating potential or internal plasma resistance that directly relate to the plasma were incapable of being identified with reasonable outlay. The measurement of the direct layer temperature was also previously difficult to design since a specific test substrate, for example having an applied resistance thermometer must be generally employed for that purpose. Added thereto is again the sensitivity to a plasma influence deriving from the variable resistance.

SUMMARY OF THE INVENTION

It is an object of the invention to specify a method that avoids the described disadvantages, i.e., particularly eliminates the plasma influence and manages without using a reference substrate.

In a method for in situ measurement, this object is inventively achieved in that a current is generated by at least one voltage or current source in a circuit that is composed of a first current branch, the sheet resistivity, and a second current branch;

the parasitic current $I_P$ injected into the layer by the plasma is formed of a first part and of a second part that are symmetrically supplied into the two current branches each having the same resistance overall;

the currents $I_A$ and $I_B$ thus actually flowing in the first and second current branch are respectively measured either directly or with the voltage drop-off at known precision resistors;

a measured current $I_M$ independent of the plasma influence is calculated from the currents $I_A$ and $I_B$ by averaging;

the sheet resistivity is identified from the identified measured current $I_M$ and from the measurement of the voltage drop-off at the sheet resistivity.

Developments and applications of the invention are provided such as making the voltage or current source a direct current or an alternating current having defined frequency. Additionally, the two symmetrical current branches can each respectively contain a voltage source and a precision resistor $R_{M1}$ and $R_{M2}$. The two precision resistors $R_{M1}$ and $R_{M2}$ are selected such that the same voltage approximately drops off respectively at the two precision resistors and at the layer. The precision resistors $R_{M1}$ and $R_{M2}$ are matched to the varying sheet resistivity, particularly step-by-step, during the layer of manufacture. A measured signal is taken at four points (4-point measuring method), preferably at a standard silicon substrate, whereby two respective points each serve the purpose of contacting each current branch composed of two current paths for separate current impression and voltage measurement, and whereby a low-pass filter is preferably provided in each of the four current paths. The four-point measurement can be implemented according to the Van der Bauw method. Additionally, the temperature of the layer can be measured. The two current branches can be shorted without voltage or current sources for identifying the ion current or respectively, the internal plasma resistance of the plasma. The voltage or current sources can respectively be replaced by a line interruption for identifying the floating potential.

As a result of the symmetrical measurement set-up as viewed preceding from the plasma, the invention allows a complete elimination of the plasma influence and, thus, an error-free measurement of the sheet resistivity. The measured quantities can be taken directly from the workpiece to be processed, for example, a standard substrate, by contacts. It is also thereby possible to position the measurement electronics outside the process chamber, and as a result, problems involving the temperature stability are eliminated and the contamination of the process chamber, that is particularly critical in view of the residual gas quality, can be avoided. Fundamentally, however, it is within the scope of the invention to utilize the method with a reference substrate and/or with a telemetric transmission of measured values. Over and above this, the method of the invention can be developed, with little outlay, wherein the individual measured quantities of layer temperature, ion current, floating potential and internal plasma resistance can be acquired. Further, the measurement dynamic required for the adaptation to the sheet resistivity which is variable during the layer manufacture can be implemented in a simple way. Finally, the measuring current can be impressed by a direct current source or by an alternating current source having a defined carrier frequency.

The invention shall be set forth in greater detail below with reference to an exemplary embodiment and the four figures of the attached drawings.

DETAILED DESCRIPTION OF THE PREFERRED EMBODIMENTS

Figure 1:
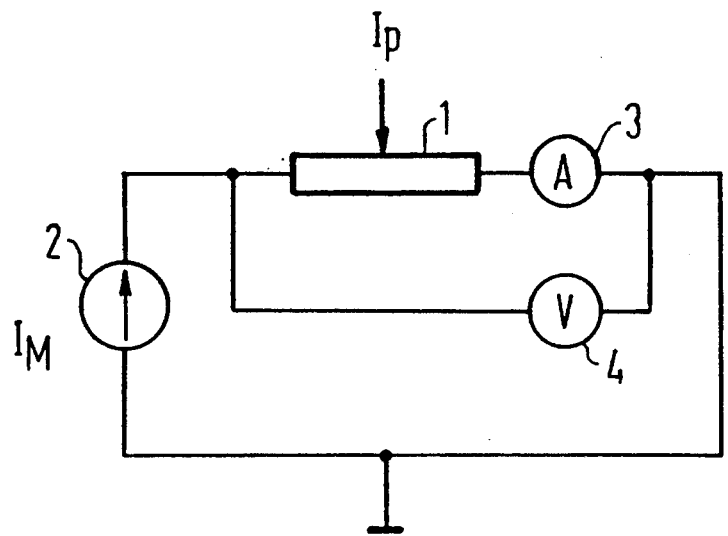
FIG. 1 is a schematic diagram for a known circuit for measuring resistivity.

FIG. 1 shows the fundamental structure from which, according to E. Schruefer, "Elektrische Messtechnik", C. Hanser-Verlag Muenchen 1983, one can proceed for measuring ohmic resistances. A circuit having a resistance 1 to be measured and a voltage source 2 impressing a measuring current $I_M$ are shown. Without disturbing plasma influence, the resistance 1 can be simply defined with a meter current 3 and a voltmeter means 4.

When, instead, a sheet resistivity that is exposed to a plasma is to be measured, then the impressed measuring current $I_M$ is not the only determining factor for measurements. On the contrary, since ions, as well as electrons in addition to neutral particles, impinge the material to be coated, a parasitic current $I_P$ is also injected into the layer and must be taken into consideration. As a consequence of the unavoidable branching of the parasitic current $I_P$ indicated in FIG. 1 into the current branches leading away from the resistance, asymmetrical conditions with respect to the proportion of the injected parasitic current derive in the two current branches. It is therefore not adequate for eliminating the influence of the plasma to evaluate only the parasitic current part in one of the two current branches. The successive measurement with two different measuring currents of known size proposed in said European Patent 0 146 720 can therefore only computationally eliminate one parasitic current, this not corresponding to the actual parasitic current.

Figure 2:
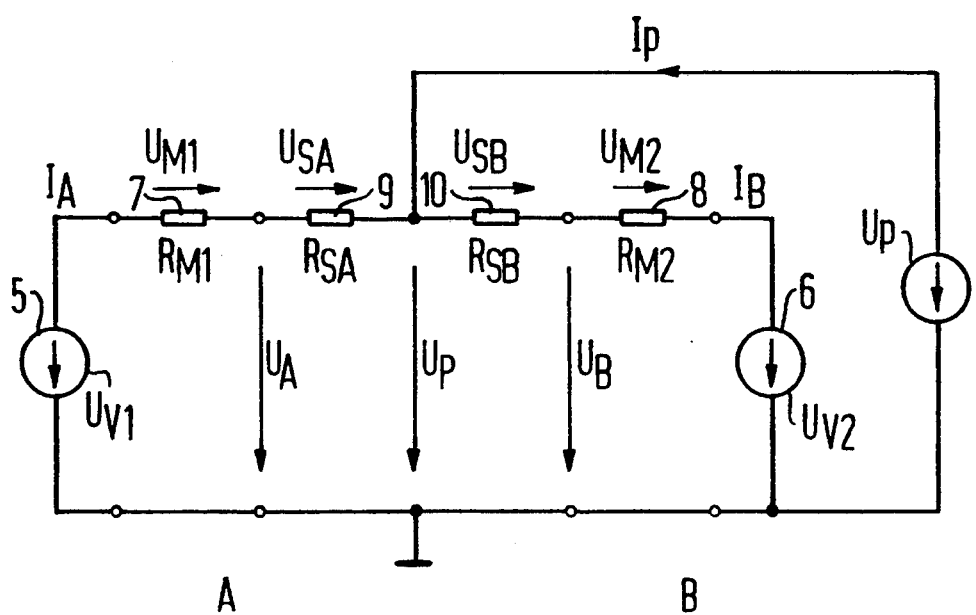
FIG. 2 is a schematic diagram of circuit arrangements for the implementation of the method of the invention.

FIG. 2 shows a circuit arrangement for the implementation of a method of the invention, whereby two symmetrical current branches A and B, each respectively having a voltage source 5 and 6, are provided, the voltage sources 5, 6 generating voltages $U_{V1}$ and $U_{V2}$, and whereby respective precision resistors 7 and 8 having resistances $R_{M1}$, $R_{M2}$ respectively are provided. When the plasma is activated, disturbances are induced in the circuit via the layer to be measured. The procedures in the method and their relationships to the circuit arrangement can now be set forth with reference to the equivalent circuit diagram of FIG. 2.

The two voltage sources 5 and 6 impress a defined current dependent on the resistances in the circuit on the unit under test that is composed of the two sheet resistivities 9 and 10. This current superimposes with two opposite parts of the parasitic current $I_P$ that are equal, however, in terms of amount, and that are supplied into the current branches A and B by the plasma via the layer. This results in the fact that it is no longer the originally impressed current by the voltage sources 5, 6 but currents $I_A$ and $I_B$, that differ from one another, that flow therein. These lead to voltage drop-offs $U_{M1}$ at $R_{M1}$, $U_S$ at the sheet resistivity ($R_S$), and $U_{M2}$ at $R_{M2}$. Given known precision resistors 7 and 8, a measured current $I_M$ that is independent of the plasma influence can be calculated via the voltage drop offs at these precision resistors and by averaging. The value of $U_S$ is set via $I_M$ and, thus, via the two voltage sources 5 and 6. Quantities $U_A$ and $U_B$ indicate the potential respectively preceding or, respectively, following the unit under test, from which, together with $I_M$, the sheet resistivity can be defined. The structure having two precision resistors is to be selected in order to obtain a symmetrical structure of the measurement circuit as viewed preceding from the plasma, as a result whereof the plasma influence, that is the same in the current branches A and B but oppositely directed, can be identified.

The plasma acts as voltage source Up having variable internal resistance. Since the internal resistance, however, is low, the plasma can be represented as an ideal voltage source. The following relationship confirmed by measurements occurs:

$$U_{V1} > U_P > U_{V2} \qquad (1)$$

Via the unit under test, the voltage source Up impresses the parasitic current $I_P$ into the measurement circuit. Since the measurement circuit, as viewed proceeding from the plasma, divides into the two current branches A (having the current $I_A$) and B (having the current $I_B$), the parasitic current $I_P$ is divided into two parts $I_{P1}$ and $I_{P2}$. Valid are:

$$I_A + I_P - I_B = 0, \text{ i.e., } I_P = I_B - I_A \qquad (2)$$

and $$I_P = I_{P2} + I_{P1} = (I_M + I_{P2}) - (I_M - I_{P1}) \qquad (3)$$

together, thus:

$$I_B = (I_M + I_{P2}) \qquad (4)$$

$$I_A = (I_M - I_{P1}) \qquad (5)$$

Since the disturbance attacks within the unit under test, the unit under test divides into two individual resistivities $R_{SA}$ and $R_{SB}$ (see FIG. 2). $R_S = R_{SA} + R_{SB}$ is valid, for which reason the following must be set up:

$$-U_A + U_{SA} + U_{SB} + U_B = 0 \qquad (6)$$

The voltage $U_{SA}$ or, respectively, $U_{SB}$ drops off at the resistances due to the current $I_A$ and $I_B$ flowing in the respective branch. What is valid upon employment of equation (4) and (5) are:

$$U_{M1} = R_{M1} * I_A = R_{M1} * (I_M - I_{P1}) \qquad (7)$$

$$U_{M2} = R_{M2} * I_B = R_{M2} * (I_M - I_{P2}) \qquad (8)$$

$$U_{SA} = R_{SA} * I_A = R_{SA} * (I_M - I_{P1}) \qquad (9)$$

$$U_{SB} = R_{SB} * I_B = R_{SB} * (I_M - I_{P2}) \qquad (10)$$

The interior of the unit under test is not accessible to a measurement. The quantities $U_{SA}$ or, respectively, $U_{SB}$ can thus not be directly identified. A direct measurement of the current $I_P$ or, respectively, $I_{P1}$ and $I_{P2}$ induced on the unit under test by the plasma is likewise not metrologically possible. $R_{Schicht}$ must therefore be indirectly determined.

An averaging over $U_{M1}$ and $U_{M2}$ supplies:

$$\tfrac{1}{2}(U_{M1}+U_{M2})=\tfrac{1}{2}((R_{M1}*I_M)-((R_{M1}*I_{P1})+(R_{M2}*I_M)+((R_{M2}*I_{P2}))) \qquad (11)$$

When the relationships $R_{M1} = R_{M2} = R_M$ and $I_{P1} = I_{P2}$ are valid in the circuit, equation (11) is simplified to:

$$\tfrac{1}{2}(U_{M1}+U_{M2})=R_M * I_M \qquad (12)$$

Following from equations (6), (9), and (10):

$$U_A - U_B = U_{SA} + U_{SB} = (R_{SA}*I_M)-(-R_{SA}*I_{P1})+(R_{SB}*I_M)+(R_{SB}*I_{P2}) \qquad (13)$$

Upon assumption of the relationships $R_{SA} = R_{SB}$ and $I_{P1} = I_{P2}$, equation (13) is simplified to:

$$U_A - U_B = (R_{SA} + R_{SB}) * I_M = R_{Schicht} * I_M \qquad (14)$$

With the assistance of equations (12) and (14) and with $U_{M1} = R_{M1} * I_M$, $R_{Schicht}$ is calculated as:

$$R_{Schicht}=(U_A-U_B)/I_M=(U_A-U_B)/ \\ (\tfrac{1}{2}(U_{M1}+U_{M2})/R_M)=(2*(U_A-U_B)*R_M)/(U_{V1}-U_A+U_B-U_{V2}), \qquad (15)$$

since $U_{M1} + U_A - U_{V1} = 0$ and $U_{M2} + U_{V2} - U_B = 0$ are also true.

As in the undisturbed case, thus, the measurement of the sheet resistivity is based on a voltage measurement (4×single-ended to ground or 2×differentially at $R_{MX}$ and at the unit under test). The influence of the plasma is thereby completely eliminated.

The calculation of the resistance of the unit under test was thereby based on the following assumptions:

$$R_{M1} = R_{M2} = R_M \qquad (A1)$$

$$R_{SA} = R_{SB} \qquad (A2)$$

$$I_{P1} = I_{P2} \qquad (A3)$$

Assumption (A1) can be easily realized in circuit-oriented terms on the basis of a specific selection of resistance. When assumption (A1) is assured the plasma, i.e., $U_P$, encounters a symmetrical measurement structure (i.e., the total resistance in both branches is the same). Since the sheet resistivity is also uniform over the entire unit under test, fully symmetrical relationships arise wherein the assumption (A2) is permissible and $U_P$ is set in the middle of $U_A$ and $U_B$, and since $R_{M1} = R_{M2}$, $U_P$ is set in the middle of $U_{V1}$ and $U_{V2}$, $(U_P = \tfrac{1}{2}(U_{V1} + U_{V2}) = -\tfrac{1}{2}(U_A + U_B))$. $I_{P1} = I_{P2}$ is thus also valid. On the other hand, it becomes clear that the measurement no longer functions given an asymmetrical structure, since all assumptions (A1 through A3) that must be made for an elimination of the influence of the plasma are violated.

As already addressed, the current in the circuit is identified via the precision resistors 7 and 8. It is advantageous for reasons of measuring precision to select the two precision resistances $R_{M1}$ and $R_{M2}$ such that approximately the same voltage drops off at respectively the two precision resistances and at the layer ($U_S = U_{M1} = U_{M2}$). The precision resistors should therefore always be matched to the respective sheet resistivity because of the greatly varying sheet resistivity during the manufacture, given a deposition of interconnects on a silicon substrate. For example, one must count on a drop-off from 10 M Ohms to 1 Ohm but must count on a corresponding rise given a layer structuring. A simple and reliable, possible solution is comprised in an arrangement having resistors of different values with preceding relay, these being selected via a computer. The voltage drop-off $U_S$ should be selected such that the measuring current $I_M$ remains below approximately 100 mA. For $U_{V1}$ and $U_{V2}$, a value between 1 V and 10 V, given applied, negative voltages $U_{V1}$ and $U_{V2}$, proves beneficial dependent on sheet resistivity.

The measuring method of the invention can also be implemented when the voltage sources 5 and 6 are replaced by current sources or when one voltage source is removed. The symmetrical feed of the parasitic current which is critical for success is thereby not lost since the internal resistance of a voltage source is ideally zero. Further, the measuring method can also be implemented without further ado with an alternating current measurement having defined carrier frequency. The precision resistors 7 and 8 in the two current branches can also be omitted when the current in the respective branch is directly identified.

Figure 3:
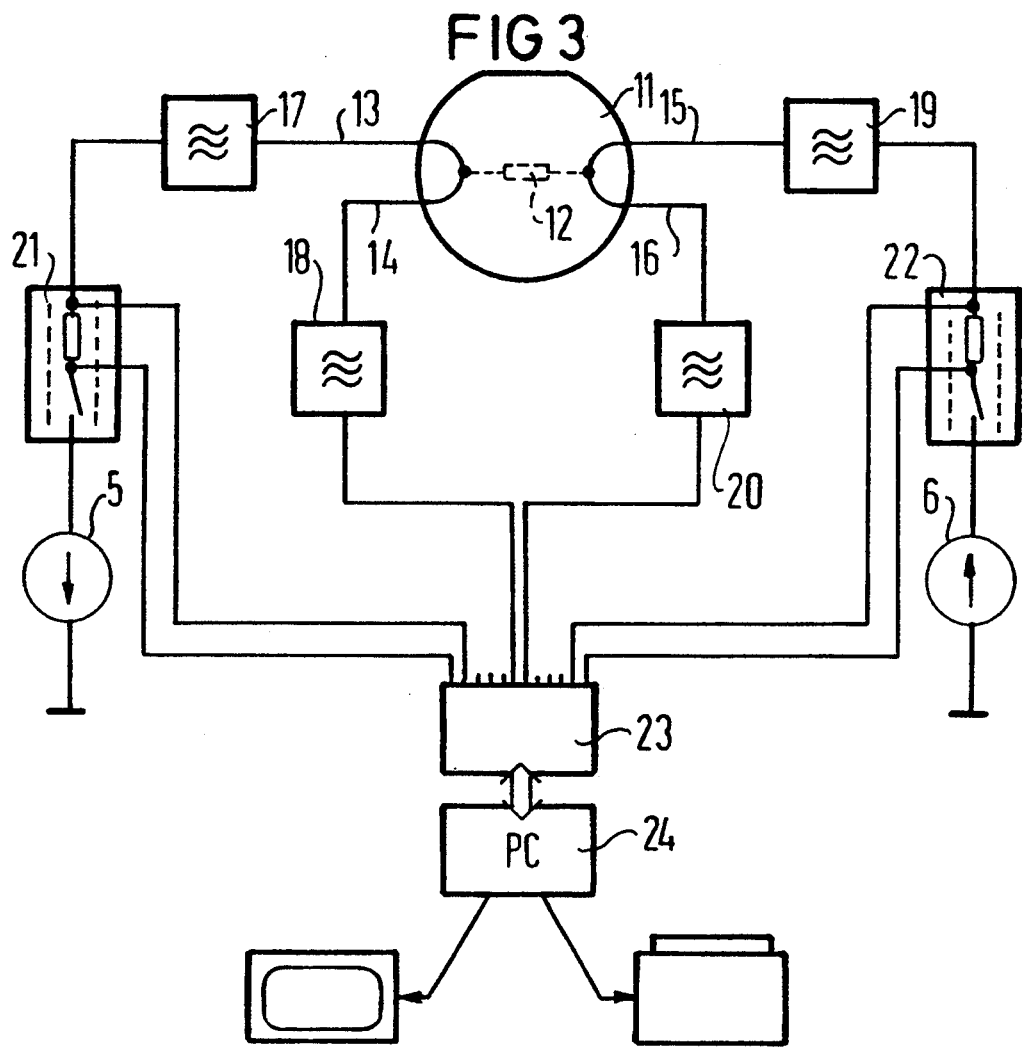
FIG. 3 is a block circuit diagram for the implementation of another method of the invention.

FIG. 3 shows the collaboration of various circuit components for the implementation of a development upon the method of the invention in a block circuit diagram. A standard silicon wafer 11 having a layer to be deposited thereon, with a sheet resistivity 12, is selected as a specific unit under test.

A measured signal is taken at four locations at the standard silicon substrate 11 covered with the layer, in accord with the known four-point measuring method. Two respective points thereby serve the purpose of contacting each current branch composed of two current paths 13 and 14 or, respectively, 15 and 16 for separate current impression and voltage measurement. It is thereby advantageous to provide a low-pass filter 17 and 18 or, respectively, 19 and 20 in each of the four current paths 13 and 14 or, respectively, 15 and 16 in order to eliminate higher-frequency disturbances deriving from the environment. A compromise between optimally low cutoff frequency and a signal falsification due to time constants must be found as limit frequency for the low-pass filters. A typical cut-off frequency is 100 Hz. An arrangement 21 or, respectively, 22 having resistances with various values and having the selection relay and a voltage source 5 or, respectively, 6 is also indicated in each of the current branches in FIG. 3. The pick-up of the measured value ensues via an analog-to-digital converter 23 that is coupled to a PC 24 as process computer. The display of the measured values, for example, can ensue with a picture screen or with a printer.

A measurement of resistance according to the Van Der Pauw method (cyclical interchange of the current-/voltage contacts) is also possible with the measuring structure of FIG. 3. A two-point measurement, of course, is also fundamentally possible but seems less advantageous due to the falsification of the measured values given small resistances on the extent of the contact resistances.

It must also be considered advantageous in the method of the invention that problems with the contacting or the transmission of the measured values are overcome. It is readily possible to contact the silicon substrate with, for example, a slip ring and to provide a vacuum bushing for the communication of the measured values, so that the measurement is also not subject to any temperature limitations whatsoever due to the arrangement of the measuring electronics outside the process chamber.

For temperature measurement, for example, a platinum layer can be directly applied on the wafer at a standard substrate between two insulating layers and the temperature can be identified via the electrical resistance of the platinum layer. The identification can ensue, for instance, by comparison to a calibration curve. Since, in the case of a temperature measurement, the dynamics of the measured quantity is not so great that the precision resistor must be constantly matched to the sheet resistivity, the arrangement of individual resistors can be locked to one position in order to simplify the measuring structure. The contacting can again ensue via four free contact points on the platinum layer or, respectively, via contacting locations that are connected to the platinum layer.

Figure 4:
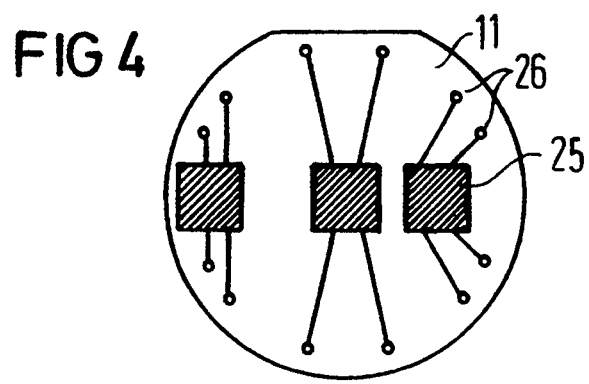
FIG. 4 is an arrangement for contacting a layer to be measured in accord with the invention.

FIG. 4 shows a plurality of platinum structures 25 distributed on a silicon substrate 11 and connected to contacting locations 26. It thereby becomes possible to register a topical resolution of the substrate temperature.

When the method of the invention is to be employed for measuring the ion current or, respectively, the internal plasma resistance, the voltage sources in the two current branches are to be replaced by a short. The conductive layer whose sheet resistivity is to be identified serves as sensor for the process parameters. The ion current is identified via a measurement of the current at both current branches. The current density can be then identified given a known substrate area. It must be noted that the current measurements must generally be executed in extremely low-impedance fashion. When the sheet resistivity of the sensor layer is higher than, typically, approximately 500 ohms, then this sheet resistivity must be taken into consideration when measuring the current. Even given such a low-impedance measurement, it is important to utilize a symmetrical measuring structure since the measured errors, although otherwise in fact can be kept small, cannot be eliminated.

The internal plasma resistance can be identified via the load measurement of the plasma. A variable resistor having complex component, for example a branch in a resistor network, is inserted as precision resistor $R_M$. Given variation of $R_M$, for example via the process-controlled computer, the plasma voltage that is measured at one of the two sides of the substrate to ground collapses at a defined threshold, which then characterizes the respective internal plasma resistance. Given a plasma assumed as an ohmic resistor, this threshold is 50% of the original plasma voltage.

For employment for a measurement of floating potential, finally, both voltage sources can also be replaced by a line interruption. As in the measurement of the ion current, the conductive layer serves as sensor. The floating potential can now be measured by measuring one of the two voltage values adjacent to the wafer to ground, whereby one must take care to see to a high-impedance measurement.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. A method for the in-situ identification of the sheet resistivity of thin, electrically conductive layers manufactured under the influence of a plasma, comprising the steps of:

providing a circuit having at least one source for generating a current, a first current branch, the sheet resistivity of the layer, and a second current branch in series with the sheet resistivity between the first and second current branch, each current branch having the same total resistance;

generating a current through said circuit from said source;

from a parasitic current injected into the layer by the plasma, forming a first current part $I_{p1}$ and a second current part $I_{p2}$ that are symmetrically supplied into the two current branches;

measuring a first resultant current $I_A$ and a second resultant current $I_B$ in the first and second current branch respectively;

calculating a measuring current $I_m$ independent of the plasma influence by averaging the first and second resultant currents $I_A$ and $I_B$;

calculating the sheet resistivity from the measuring current $I_m$ and from a measurement of a voltage drop $U_S$ across the layer.

2. A method according to claim 1, wherein said step of generating a current is further defined in that said at least one source generates a direct current.

3. A method according to claim 1, wherein said step of generating a current is further defined in that said at least one source generates an alternating current having defined frequency.

4. A method according to claim 1, wherein said step of providing a circuit is further defined in that the first and second current branches are two symmetrical current branches each of which respectively contains a voltage source and a precision resistor.

5. A method according to claim 4, wherein said step of providing a circuit is further defined in that the two precision resistors are selected such that a voltage drop $U_{m1}$, $U_{m2}$ respectively across each of the two precision resistors and the voltage drop $U_s$ across the layer are substantially equal.

6. A method according to claim 5, wherein said step of providing a circuit is further defined in that the precision resistors are matched to the varying sheet resistivity, particularly step-by-step, during the layer manufacture.

7. A method according to claim 1, comprising the further steps of: measuring signals at four points on a silicon substrate, and providing that each current branch comprises two current paths for separate current impression and voltage measurement, and whereby a low-pass filter is preferably provided in each of the four current paths.

8. A method according to claim 7, wherein said step of measuring signals is further defined in that the measurement at said four points is implemented according to the Van Der Pauw method.

9. A method according to claim 1 comprising the further step of correlating the calculated sheet resistivity for calculating the temperature of the layer.

10. A method according to claim 1, comprising the further step of shorting the two current branches through said at least one source for identifying the ion current or, respectively, the internal plasma resistance of the plasma.

11. A method according to claim 1, comprising the further step of open circuiting said at least one source for identifying the floating potential.

* * * * *